United States Patent
Shi et al.

(10) Patent No.: US 10,068,779 B2
(45) Date of Patent: Sep. 4, 2018

(54) SYSTEMS AND METHODS FOR FABRICATING A POLYCRYSTALINE SEMICONDUCTOR RESISTOR ON A SEMICONDUCTOR SUBSTRATE

(71) Applicant: Cirrus Logic, Inc., Austin, TX (US)

(72) Inventors: Zhonghai Shi, Austin, TX (US); Vince Deems, Austin, TX (US); Hong Tian, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/675,242

(22) Filed: Aug. 11, 2017

(65) Prior Publication Data

US 2017/0338126 A1    Nov. 23, 2017

Related U.S. Application Data

(62) Division of application No. 14/297,008, filed on Jun. 5, 2014, now Pat. No. 9,761,461.

(Continued)

(51) Int. Cl.

| | |
|---|---|
| *H01L 21/32* | (2006.01) |
| *H01L 21/3205* | (2006.01) |
| *H01L 21/763* | (2006.01) |
| *H01L 49/02* | (2006.01) |
| *H01L 21/762* | (2006.01) |
| *H01L 29/06* | (2006.01) |
| *H01L 27/08* | (2006.01) |

(52) U.S. Cl.
CPC ...... *H01L 21/32055* (2013.01); *H01L 21/763* (2013.01); *H01L 21/76224* (2013.01); *H01L 27/0802* (2013.01); *H01L 28/20* (2013.01); *H01L 29/0649* (2013.01)

(58) Field of Classification Search
CPC ......... H01L 21/32055; H01L 21/76224; H01L 29/0649; H01L 27/0802
See application file for complete search history.

(56) References Cited

U.S. PATENT DOCUMENTS

| | | |
|---|---|---|
| 4,772,571 A | 9/1988 | Scovell et al. |
| 5,108,945 A | 4/1992 | Matthews |

(Continued)

FOREIGN PATENT DOCUMENTS

CN     1387261 A    12/2002

OTHER PUBLICATIONS

First Examination Opinion Notice, State Intellectual Property Office of the People's Republic of China, Application No. 201410548958.4, dated Mar. 26, 2018.

*Primary Examiner* — Matthew Reames
(74) *Attorney, Agent, or Firm* — Jackson Walker L.L.P.

(57) ABSTRACT

In accordance with embodiments of the present disclosure, an integrated circuit may include at least one region of shallow-trench isolation field oxide, at least one region of dummy diffusion, and a polycrystalline semiconductor resistor. The at least one region of shallow-trench isolation field oxide may be formed on a semiconductor substrate. The at least one region of dummy diffusion may be formed adjacent to the at least one region of shallow-trench isolation field oxide on the semiconductor substrate. The polycrystalline semiconductor resistor may comprise at least one resistor arm formed with a polycrystalline semiconductor material, wherein the at least one resistor arm is formed over each of the at least one region of shallow-trench isolation field oxide and the at least one region of dummy diffusion.

5 Claims, 4 Drawing Sheets

Related U.S. Application Data

(60) Provisional application No. 61/980,271, filed on Apr. 16, 2014.

(56) References Cited

U.S. PATENT DOCUMENTS

| | | |
|---|---|---|
| 5,258,329 A | 11/1993 | Shibata |
| 6,005,280 A | 12/1999 | Dierschke et al. |
| 2002/0171111 A1 | 11/2002 | Haruhana et al. |
| 2011/0148466 A1 | 6/2011 | Aton |
| 2013/0140564 A1 | 6/2013 | Lutz |

SYSTEMS AND METHODS FOR FABRICATING A POLYCRYSTALINE SEMICONDUCTOR RESISTOR ON A SEMICONDUCTOR SUBSTRATE

RELATED APPLICATION

This application is a divisional of U.S. Non-Provisional application Ser. No. 14/297,008 filed on Jun. 5, 2014, which claims the benefit of U.S. Provisional Application No. 61/980,271 filed on Apr. 16, 2014, each of which are incorporated by reference herein in its entirety.

FIELD OF DISCLOSURE

The present disclosure relates in general to semiconductor fabrication, and more particularly, to fabrication of a polycrystalline semiconductor resistor on a semiconductor substrate.

BACKGROUND

Semiconductor device fabrication is a process used to create integrated circuits that are present in many electrical and electronic devices. It is a multiple-step sequence of photolithographic, mechanical, and chemical processing steps during which electronic circuits are gradually created on a wafer made of semiconducting material. For example, during semiconductor device fabrication, numerous discrete circuit components, including transistors, resistors, capacitors, inductors, and diodes may be formed on a single semiconductor die.

In many applications, semiconductor device fabrication may employ shallow trench isolation (STI). STI is an integrated circuit feature which may prevent electrical current leakage between adjacent semiconductor components, especially for relatively fine feature sizes (e.g., less than 250 nm). STI is often created early during the semiconductor device fabrication process, before transistors and other circuit components are formed. Formation of STI typically involves etching a pattern of trenches in a semiconductor substrate, depositing one or more dielectric materials (e.g., a semiconductor oxide) to fill the trenches, and removing the excess dielectric using a technique such as chemical-mechanical planarization (CMP).

Fabrication tools used for CMP, such as CMP polish pads, often have some elasticity. Accordingly, if there is an STI region with a large area, then the dielectric material existing in the STI trench might be excessively removed near its center. As a result, such portion of the dielectric material might have its height decreased below the height it would have if polishing were ideally planar, an unwanted phenomenon known as "dishing." The height decrease created in this manner may deform a pattern to be defined in a subsequent lithographic process because a depth of focus may be insufficient.

To prevent the occurrence of dishing, a semiconductor fabrication process may include formation of dummy diffusion within a region of STI. Dummy diffusion may include unetched or deposited semiconductor material of the same semiconductor material making up the semiconductor substrate, but for which no transistor source or drain electrodes are formed. During layout of mask design for the semiconductor manufacturing process, stringent design rules may be applied to ensure an STI region includes a desired level of diffusion density so as to avoid both the electrical current leakage and STI dishing issues described above.

An integrated circuit may include various sized resistors. Larger-sized resistors in an integrated circuit may require more area. Resistors are often formed within integrated circuits using patterns of polycrystalline semiconductor material (e.g., polysilicon). Such resistors are sometime referred to as "polyresistors." To meet diffusion density design rules when fabricating such resistors, dummy diffusion must often be added within the footprint of the resistors. As shown in FIGS. 1A and 1B, to meet such design rules, a polyresistor may be fabricated on a semiconductor substrate 100 using a plurality of parallel polycrystalline semiconductor resistor arms 102 formed over STI field oxide 104, with dummy diffusion 106 in between resistor arms 102, and metallization 108 perpendicular to resistor arms 102 coupling resistor arms 102 to one another. A drawback to this approach is that dummy diffusion 106 adds significant area to a die layout. Another drawback may be that model accuracy may be compromised if a resistor arm 102 is not a sufficient distance from a neighboring diffusion 106 to ensure that resistor arm 102 is formed on a flat portion of STI 104.

SUMMARY

In accordance with the teachings of the present disclosure, certain disadvantages and problems associated with fabricating a polycrystalline semiconductor resistor on a semiconductor substrate may be reduced or eliminated.

In accordance with embodiments of the present disclosure, a method for fabricating a polycrystalline semiconductor resistor for an integrated circuit may include forming at least one region of shallow-trench isolation field oxide on a semiconductor substrate. The method may also include forming at least one region of dummy diffusion adjacent to the at least one region of shallow-trench isolation field oxide on the semiconductor substrate. The method may further include forming a polycrystalline semiconductor resistor comprising at least one resistor arm formed with a polycrystalline semiconductor material, wherein the at least one resistor arm is formed over each of the at least one region of shallow-trench isolation field oxide and the at least one region of dummy diffusion.

In accordance with these and other embodiments of the present disclosure, an integrated circuit may include at least one region of shallow-trench isolation field oxide, at least one region of dummy diffusion, and a polycrystalline semiconductor resistor. The at least one region of shallow-trench isolation field oxide may be formed on a semiconductor substrate. The at least one region of dummy diffusion may be formed adjacent to the at least one region of shallow-trench isolation field oxide on the semiconductor substrate. The polycrystalline semiconductor resistor may comprise at least one resistor arm formed with a polycrystalline semiconductor material, wherein the at least one resistor arm is formed over each of the at least one region of shallow-trench isolation field oxide and the at least one region of dummy diffusion.

In accordance with these and other embodiments of the present disclosure, a polycrystalline resistor may include at least one resistor arm formed with a polycrystalline semiconductor material. The at least one resistor arm may be formed over at least one region of shallow-trench isolation field oxide formed on a semiconductor substrate. The at least one resistor arm may be formed over at least one region of dummy diffusion formed adjacent to the at least one region of shallow-trench isolation field oxide on the semiconductor substrate.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
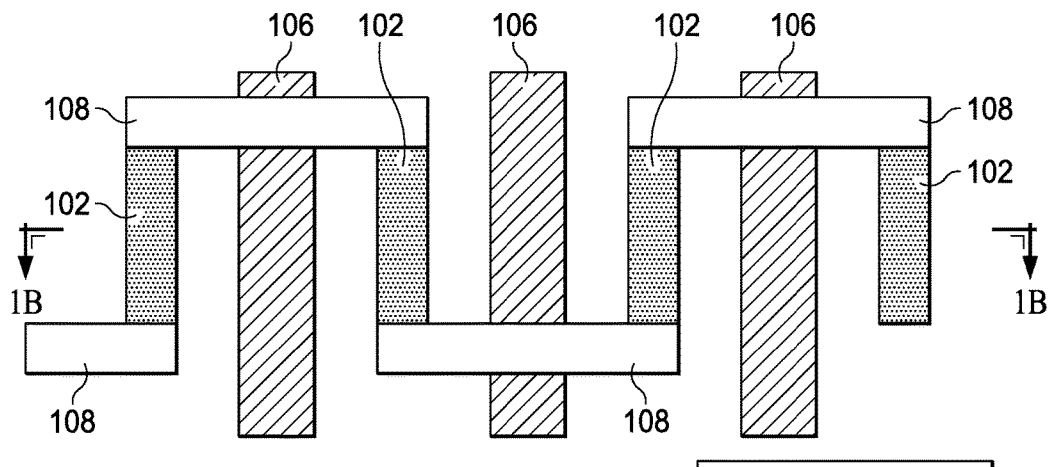
FIGS. 1A and 1B illustrate an elevation view and a plan view, respectively, of a portion of a semiconductor substrate with a polycrystalline semiconductor resistor fabricated thereon, as is known in the art.
Figure 1B:
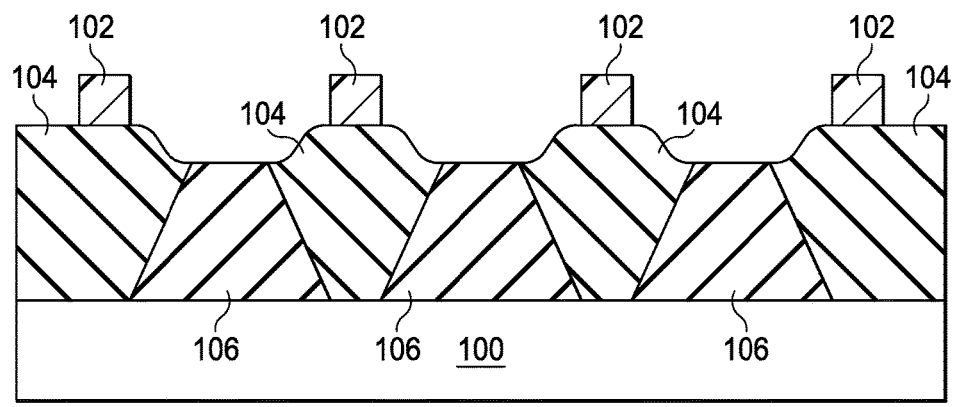
Figure 2:
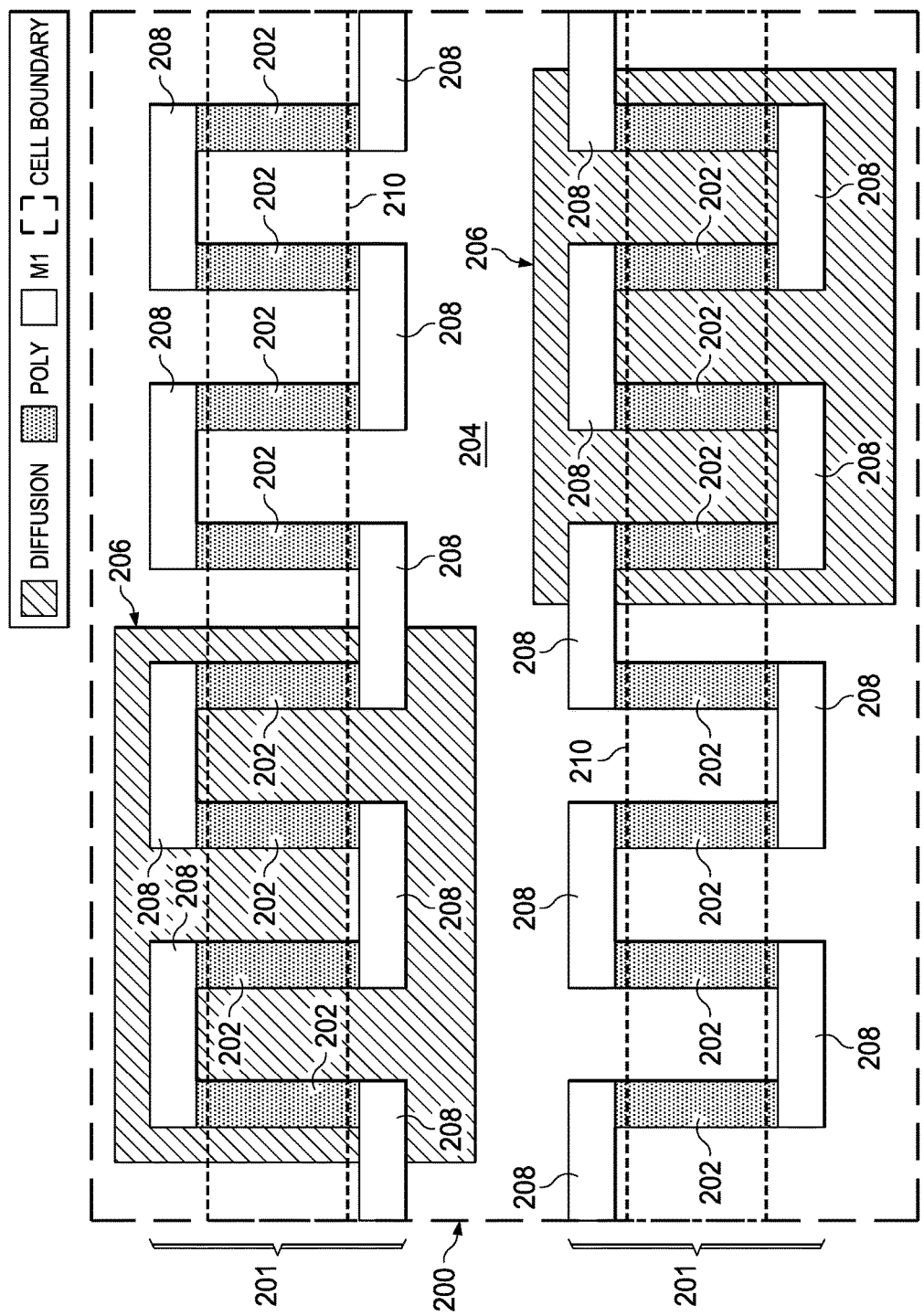
FIG. 2 illustrates a plan view of a portion of a semiconductor substrate with a polycrystalline semiconductor resistor cell fabricated thereon, in accordance with embodiments of the present disclosure.

FIG. 2 illustrates a plan view of a portion of a semiconductor substrate with a polycrystalline semiconductor resistor cell 200 fabricated thereon, in accordance with embodiments of the present disclosure. Semiconductor resistor cell 200 may be formed upon any suitable semiconductor substrate, including without limitation silicon, silicon carbide, germanium, gallium phosphide, gallium nitride, gallium arsenide, indium phosphide, indium nitride, indium arsenide, etc. As shown in FIG. 2, a polycrystalline semiconductor resistor cell 200 may include one or more resistor strings 201. Each resistor string 201 may be formed with a plurality of parallel polycrystalline semiconductor resistor arms 202, with metallization 208 perpendicular to resistor arms 202 coupling resistor arms 202 to one another. Each resistor arm 202 may be formed using any suitable polycrystalline semiconductor material (e.g., for silicone substrates, polysilicon). Metallization 208 may be formed from any suitable electrically conductive material, including without limitation gold, silver, copper, or aluminum. In some embodiments, instead of metallization 208, additional polycrystalline semiconductor resistor arms 202 may be formed perpendicular to resistor arms 202 in order to couple resistor arms 202 to one another. Each resistor string 201 may include at least one resistor arm 202 formed over STI field oxide 204 and one resistor arm 202 formed over dummy diffusion 206. STI field oxide 204 may include any suitable dielectric material (e.g., semiconductor oxide, such as silicon dioxide). A dummy diffusion 206 may include unetched or deposited semiconductor material of the same semiconductor material making up the semiconductor substrate upon which polycrystalline semiconductor resistor cell 200 is fabricated, but for which no transistor source or drain electrodes are formed. To accurately control the resistivity of resistor arms 202, a dielectric layer 210 (e.g., semiconductor oxide, such as silicon dioxide) may be formed over resistor arms 202.

To reduce layout area of polycrystalline semiconductor resistor cell 200, resistor arms 202 may be spaced at a minimum pitch as defined by design rules for the relevant process technology. Also, by placing a plurality of multiple resistor arms 202 on each dummy diffusion 206 and each region of STI field oxide 204, polycrystalline semiconductor resistor cell 200 may be fabricated with greater assurance that resistor arms 202 are formed on a flat surface as required by diffusion density rules and at the same time achieve minimum spacing of resistor arms 202, as compared to the prior art technique described in the Background section above. In each polycrystalline semiconductor resistor cell 200, the ratio of dummy diffusion 206 to regions of STI field oxide 204 may be such that diffusion density requirements for a particular process technology are satisfied.

As shown in FIG. 2, polycrystalline semiconductor resistor cell 200 may include a "checkerboard" pattern of dummy diffusion 206 and STI field oxide 204. To form such pattern within a polycrystalline semiconductor resistor cell 200, each of a plurality of resistor strings 201 may pass through a region of dummy diffusion 206 and a region of STI field oxide 204 such that for a first resistor string 201 and an adjacent second resistor string 201, a region of dummy diffusion 206 associated with the first resistor string 201 is adjacent to a region of STI field oxide 204 associated with the second resistor string 201, and a region of dummy diffusion 206 associated with the second resistor string 201 is adjacent to a region of STI field oxide 204 associated with the first resistor string 201.

Figure 3:
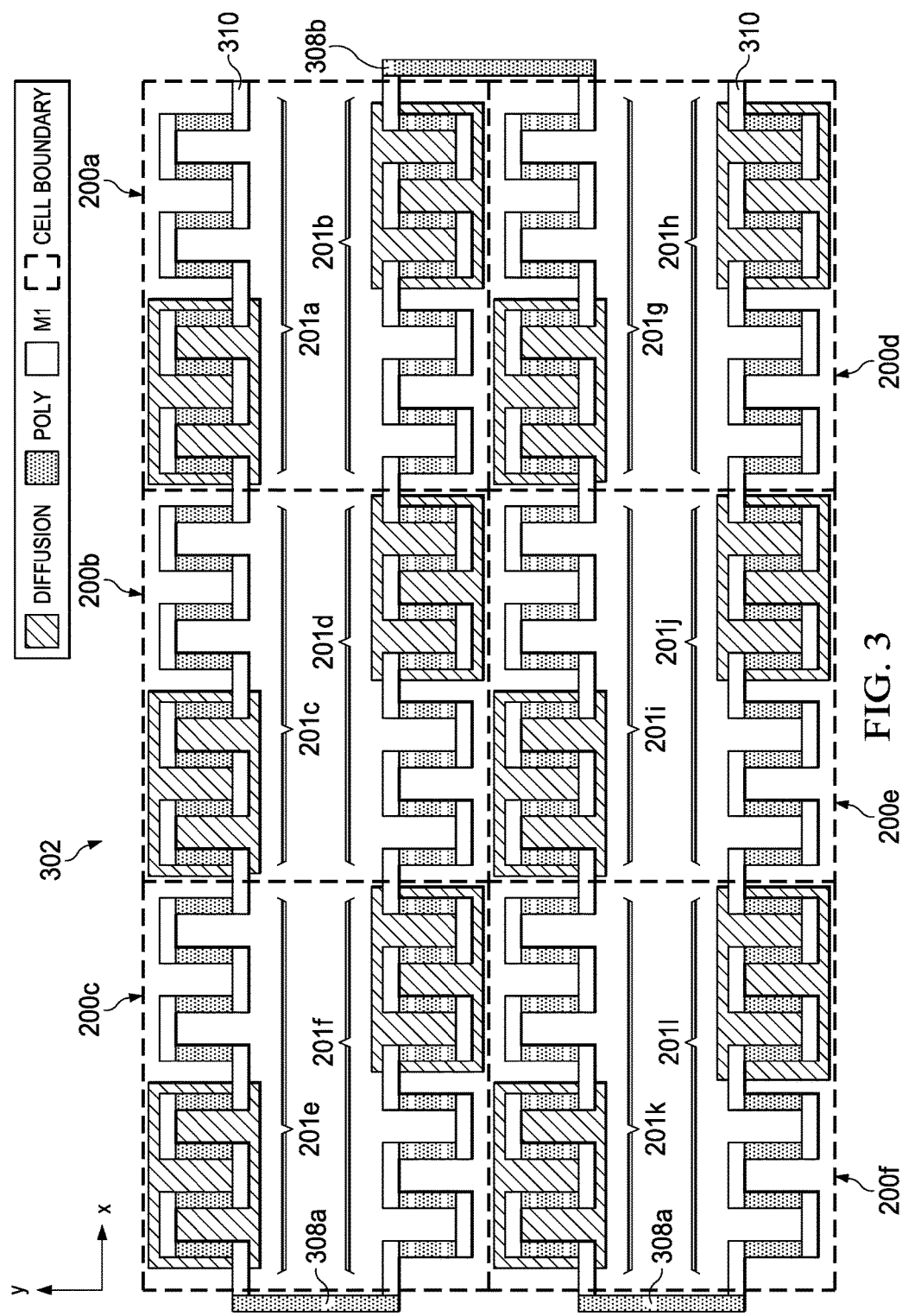
FIG. 3 illustrates a plan view of a portion of a semiconductor substrate with a plurality of polycrystalline semiconductor resistor cells fabricated thereon, in accordance with embodiments of the present disclosure.

Another advantage of polycrystalline semiconductor resistor cell 200 is that it is scalable. For example, FIG. 3 depicts a polyresistor 302 with terminals 310 wherein polyresistor 302 is formed from six polycrystalline semiconductor resistor cells 200 (e.g., polycrystalline semiconductor resistor cells 200a, 200b, 200c, 200d, 200e, 200f). To form polyresistor 302, polycrystalline semiconductor resistor cells 200 may be placed adjacent to each other such that a resistor string 201 (e.g., a resistor string 201a-201l) of one polycrystalline semiconductor resistor cell 200 may electrically couple to a resistor string 201 of an adjacent polycrystalline semiconductor resistor cell 200. For example, polycrystalline semiconductor resistor cell 200b may be placed adjacent to polycrystalline semiconductor resistor cells 200a and 200c in the direction labeled "x" in FIG. 3, such that: (i) resistor string 201c of polycrystalline semiconductor resistor cell 200b electrically couples to resistor string 201a of polycrystalline semiconductor resistor cell 200a and resistor string 201e of polycrystalline semiconductor resistor cell 200c and (ii) resistor string 201d of polycrystalline semiconductor resistor cell 200b electrically couples to resistor string 201b of polycrystalline semiconductor resistor cell 200a and resistor string 201f of polycrystalline semiconductor resistor cell 200c. As another example, polycrystalline semiconductor resistor cell 200e may be placed adjacent to polycrystalline semiconductor resistor cells 200d and 200f in the direction labeled "x" in FIG. 3, such that: (i) resistor string 201i of polycrystalline semiconductor resistor cell 200e electrically couples to resistor string 201g of polycrystalline semiconductor resistor cell 200d and resistor string 201k of polycrystalline semiconductor resistor cell 200f and (ii) resistor string 201j of polycrystalline semiconductor resistor cell 200e electrically couples to resistor string 201h of polycrystalline semiconductor resistor cell 200d and resistor string 201l of polycrystalline semiconductor resistor cell 200f.

In addition to forming polyresistor 302 by placing polycrystalline semiconductor resistor cells 200 adjacent to each other in the direction "x" depicted in FIG. 3, polycrystalline semiconductor resistor cells 200 may be adjacent to each other in the direction "y". Because two polycrystalline semiconductor resistor cells 200 which are adjacent to each other in the direction "y" do not have respective resistor strings 201 which couple to each other at a shared boundary of the two polycrystalline semiconductor resistor cells 200, resistor strings 201 of such polycrystalline semiconductor resistor cells 200 may in some instances be coupled by metallization in order to couple together in order to form polyresistor 302. For example, polycrystalline semiconductor resistor cell 200a may be adjacent to polycrystalline semiconductor resistor cell 200d in the direction "y," and metallization 308b may couple of resistor string 201b of polycrystalline semiconductor resistor cell 200a to resistor string 201g of polycrystalline semiconductor resistor cell 200d.

Furthermore, polyresistor 302 may be formed by the electrical coupling together of resistor strings 201 within the same single polycrystalline semiconductor resistor cell 200. For instance, in polycrystalline semiconductor resistor cell 200c, resistor string 201e may electrically couple to resistor string 201f via metallization 308a. As another example, in polycrystalline semiconductor resistor cell 200f, resistor string 201k may electrically couple to resistor string 201l via metallization 308a.

Accordingly, by laying out polycrystalline semiconductor resistor cells 200 in a suitable manner and electrically coupling resistor strings 201 of such polycrystalline semiconductor resistor cells 200 together, a polyresistor of desired scale may be formed having desirable resistance, area, and/or other physical properties.

In the above description, the directions "x" and "y" depicted in FIG. 3 were arbitrarily chosen solely for the purpose of clarity of exposition. In embodiments of the present disclosure, polycrystalline semiconductor resistor cells 200 may have any suitable orientation, and are not limited by the orientations depicted in FIG. 3.

Figure 4:
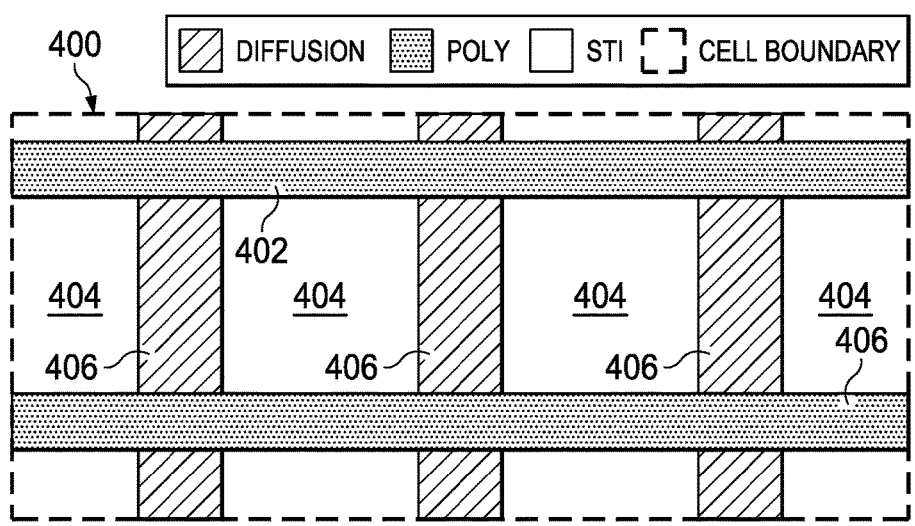
FIG. 4 illustrates a plan view of a portion of a semiconductor substrate with another polycrystalline semiconductor resistor cell fabricated thereon, in accordance with embodiments of the present disclosure.

FIG. 4 illustrates a plan view of a portion of a semiconductor substrate with another polycrystalline semiconductor resistor cell 400 fabricated thereon, in accordance with embodiments of the present disclosure. Polycrystalline semiconductor resistor cell 400 may include a plurality of polycrystalline semiconductor resistor arms 402, wherein each resistor arm 402 is formed perpendicularly to one or more dummy diffusions 406, such that a resistor arm 402 is formed over alternating regions of dummy diffusion 406 and STI field oxide 404. Resistor arms 402 of one polycrystalline semiconductor resistor cell 400 may be coupled to one or more resistor arms 402 on another adjacent polycrystalline semiconductor resistor cell 400, in order to form a polyresistor having desirable resistance, area, and/or other physical properties.

The systems and methods disclosed above may allow for large (e.g., 10 to 100 Megaohm or more) polyresistors to be fabricated on a semiconductor substrate to satisfy density requirements for dummy diffusion without compromising physical area of the integrated circuit including the polyresistors.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method comprising:
    forming at least one region of shallow-trench isolation field oxide on a semiconductor substrate;
    forming at least one region of dummy diffusion adjacent to the at least one region of shallow-trench isolation field oxide on the semiconductor substrate; and
    forming a polycrystalline semiconductor resistor, wherein forming the polycrystalline semiconductor resistor comprises:
        forming a first resistor arm with a polycrystalline semiconductor material over the at least one region of shallow-trench isolation field oxide;
        forming a second resistor arm with the polycrystalline semiconductor material over the at least one region of dummy diffusion; and
        electrically coupling between the first resistor arm and the second resistor arm an interconnect comprising an electrically conductive material other than the polycrystalline semiconductor material.

2. The method of claim 1, wherein at least one of the first resistor arm and the second resistor arm is formed perpendicularly to the at least one region of dummy diffusion.

3. The method of claim 1, further comprising forming a second polycrystalline semiconductor resistor adjacent to the polycrystalline semiconductor resistor, wherein forming the second polycrystalline semiconductor resistor comprises:
    forming a third resistor arm with the polycrystalline semiconductor material over the at least one region of shallow-trench isolation field oxide; and
    forming a fourth resistor arm with the polycrystalline semiconductor material over the at least one region of dummy diffusion.

4. The method of claim 3, wherein:
    the first resistor arm is formed over a first region of shallow-trench isolation field oxide adjacent to a first region of dummy diffusion over which the fourth resistor arm is formed; and the third resistor arm is formed over a second region of shallow-trench isolation field oxide adjacent to a second region of dummy diffusion over which the second resistor arm is formed.

5. The method of claim 3, wherein the polycrystalline semiconductor resistor and the second polycrystalline semiconductor resistor are coupled together to form a single polycrystalline semiconductor resistor comprising the polycrystalline semiconductor resistor and the second polycrystalline semiconductor resistor.

\* \* \* \* \*